(12) United States Patent
Longueville

(10) Patent No.: US 6,309,237 B1
(45) Date of Patent: Oct. 30, 2001

(54) SYSTEM WITH PRINTED CIRCUIT BOARDS THAT CAN BE PLUGGED TOGETHER

(75) Inventor: Jacques Longueville, Oostkamp (BE)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/533,624

(22) Filed: Mar. 22, 2000

(30) Foreign Application Priority Data

Mar. 22, 1999 (DE) .............................................. 199 12 858

(51) Int. Cl.⁷ .................................................. H01R 11/22
(52) U.S. Cl. ............................................ 439/267; 439/377
(58) Field of Search ............................... 439/64, 65, 267, 439/59, 62, 377, 607; 361/802

(56) References Cited

U.S. PATENT DOCUMENTS

| | | | |
|---|---|---|---|
| 3,733,523 | * 5/1973 | Reynolds et al. ..................... | 361/802 |
| 4,068,290 | * 1/1978 | Wetherbee ........................... | 361/415 |
| 5,008,778 | * 4/1991 | Peyerl ................................. | 361/415 |
| 5,055,061 | * 10/1991 | Lichtenwalter ...................... | 439/377 |
| 5,172,306 | * 12/1992 | Cantrell .............................. | 361/415 |
| 5,467,254 | * 11/1995 | Brusati et al. ...................... | 361/799 |
| 5,617,296 | * 4/1997 | Melville et al. ..................... | 361/736 |
| 5,642,264 | * 6/1997 | Cantrell .............................. | 361/802 |
| 5,648,891 | * 7/1997 | Gierut ................................. | 361/788 |
| 5,805,429 | * 9/1998 | Andersson ........................... | 361/799 |
| 5,818,696 | * 10/1998 | Knoop ................................. | 361/730 |
| 5,906,501 | 5/1999 | Longueville et al. . | |
| 6,008,995 | * 12/1999 | Pusateri et al. ..................... | 361/796 |
| 6,122,161 | * 9/2000 | Gierut ................................. | 361/683 |

* cited by examiner

Primary Examiner—Khiem Nguyen
(74) Attorney, Agent, or Firm—Schiff Hardin & Waite

(57) ABSTRACT

A system has first printed circuit boards which are plugged into a second printed circuit board mounted in a frame. The system includes guides being provided for guiding the first printed circuit boards and includes at least one guide mounted on a support element which is either adjacent or between the first printed circuit boards so that at least two printed circuit boards can be stacked one on top of the other in the plane of the first printed circuit boards.

6 Claims, 5 Drawing Sheets

SYSTEM WITH PRINTED CIRCUIT BOARDS THAT CAN BE PLUGGED TOGETHER

BACKGROUND OF THE INVENTION

The present invention is directed to a system wherein at least one printed circuit board of a first type is pluggable into a printed circuit board of a second type.

Printed circuit boards of the first type are often referred to as "plugin cards" or expressed more generally as "assemblies". Printed circuit boards of a second type are, for example, what are referred to as a "backplane printed circuit boards" or expressed more generally as "chassis".

Given systems having printed circuit boards of a first type pluggable into a printed circuit board of a second type, the printed circuit boards of the first type are plugged essentially perpendicularly into the printed circuit boards of the second type and are thereby electrically and mechanically connected thereto. For example, personal computers are known systems of this type. In such a personal computer, a number of plugin cards, for example graphic cards, modem cards, ISDN cards. sound cards, network cards, etc., are inserted into plug connections provided on the main board.

Experience shows that the number of installed plugin cards or plugin cards to be installed is increasing. On the other hand, however, the systems should become smaller and smaller.

SUMMARY OF THE INVENTION

The present invention is based on an object of improving a system having a maximum number of plugin cards which can be accommodated therein in a minimal space.

This object is achieved by an improvement in a system wherein at least one printed circuit board of a first type is pluggable into a printed circuit board of a second type. The improvement is the provision of guide elements for guiding the printed circuit boards of the first type and possibly additional guide elements provided on a support member or element extending between the printed circuit boards. According to the present invention, the guide elements are provided for guidance of the printed circuit boards of the first type and at least partially on a support element that can be arranged between the printed circuit boards of the first type. In addition, the guide elements for guidance of the printed circuit boards of the first type and for guidance of shielding plates which are being provided next to or between the printed circuit boards of the first type are provided with contact elements for the electrical contacting of the articles that they are guiding.

Given a system according to the present invention, an arbitrary plurality of printed circuit boards and printed circuit boards of an arbitrary size can be plugged into a printed circuit board connector or into a printed circuit board connector unit which comprises a plurality of printed circuit board connectors. A printed circuit board connector designed for large printed circuit boards can also be employed for one or more printed circuit boards which are smaller than the large printed circuit boards. The existing printed circuit board connectors can, thus, be optimally utilized under all conditions.

The arrangement of the guide elements to be provided for the printed circuit boards that are not as large as the largest element or are smaller than the largest printed circuit board includes a support element that is arranged next to or between the printed circuit boards, for example a shielding plate which is provided for shielding electromagnetic emissions. This shielding plate makes it possible for additional guide elements to be inserted and, therefore, additional printed circuit boards to be guided by these additional guide elements. The circuit boards can be added or removed given an operating system without disturbing or interrupting the operation of the system, and the removability or removal of the support element for the additional guide element usually does not deteriorate the function of the system.

In a system wherein the guide elements electrically contact the item being guided, the printed circuit board connectors provided at the printed circuit board of the second type can be reduced. In the extreme case, the traditional printed circuit board connectors, which are provided on the printed circuit board of the second type, can be completely eliminated.

Both systems according to the present invention make it possible to accommodate a maximum plurality of plugin cards in a minimal space.

Other advantages and features of the invention will be readily apparent from the following description of the preferred embodiments, the drawings and claims.

DESCRIPTION OF THE PREFERRED EMBODIMENTS

The principles of the present invention are particularly useful when incorporated in a system, generally indicated at 100 in FIGS. 1–5. The system can hold a plurality of printed circuit boards of a first type, which can be electrically and mechanically connected by plugging into a printed circuit board 21 of a second type. The printed circuit boards of the first type are what are referred to as "plugin cards" or expressed more generally as "assemblies" and the printed circuit board 21 of the second type, for example, is referred to as a "backplane printed circuit board" or a "chassis".

In examples under consideration, the printed circuit boards of the first type are plugged essentially perpendicularly into the printed circuit board connector pairs 211, 212 and 213, which arc mounted on the printed circuit board 21 of the second type. By plugging the printed circuit boards of the first type into the printed circuit board connector pairs 211, 212 and 213, the printed circuit board of the first type and the printed circuit board 21 of the second type are firmly electrically and mechanically connected to one another.

The printed circuit board connectors in this example being considered are zero-force printed circuit board connectors. For example, they comprise a mechanism with which they can be brought from a mounting position that allows an insertion or removal of the printed circuit board into a connecting position that properly contacts the printed circuit board or vice versa. Proceeding from the side of the printed circuit board of the first type facing away from the printed circuit board 21 of the second type, this mechanism can be actuated via actuating elements arranged at the printed circuit board of the first type and/or at guide elements provided for lateral guidance of the printed circuit boards of the first type and/or at the housing of the system. In the connecting position of the zero-force printed circuit board plug connectors, a printed circuit board inserted therein is firmly electrically and mechanically connected thereto. An additional fastening of the printed circuit board in the housing or other system components is not required in this example. A zero-force printed circuit board connector of this type is disclosed, for example, in U.S. Pat. No. 5,906,501, whose disclosure is incorporated herein by reference thereto and which claims priority from German 195 11 509.

In the example being considered, the component parts of the system arc designed for what is referred to as a "future I/O system". The future I/O system is an I/O system that is currently in the standardization phase.

It should be pointed out that there is no limitation to a connection occurring as described above for the printed circuit boards to be connected. Basically, the printed circuit boards to be connected can be arbitrary printed circuit boards that are connected to one another in an arbitrary way and in arbitrary positions.

Figure 3:
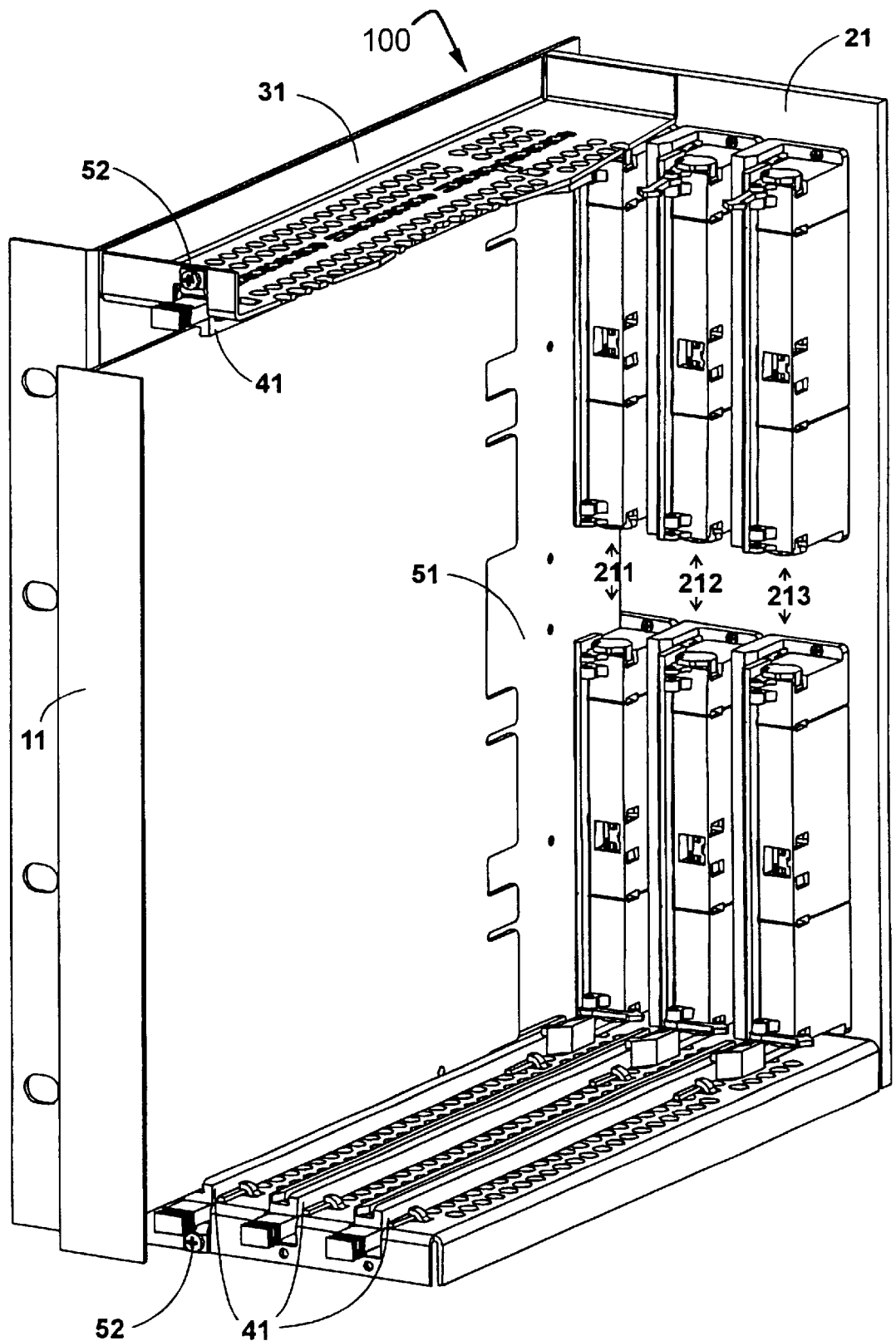
FIG. 3 is a perspective view of the system of FIG. 2 wherein a large printed circuit board is being plugged into the printed circuit board or chassis.
Figure 4:
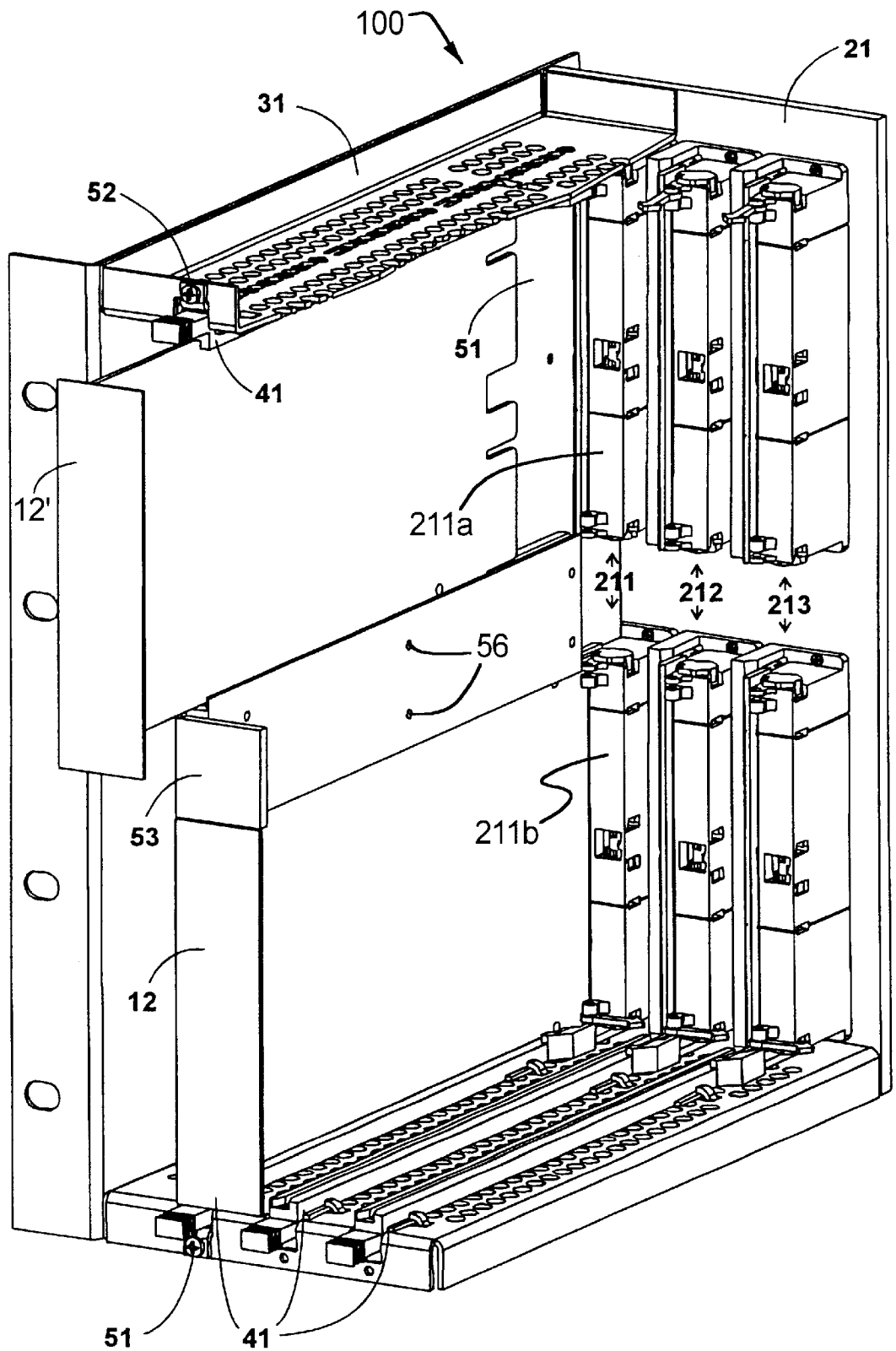
FIG. 4 is a perspective view of the system of FIG. 2 in a condition wherein two mid-sized printed circuit boards are being plugged into chassis.
Figure 5:
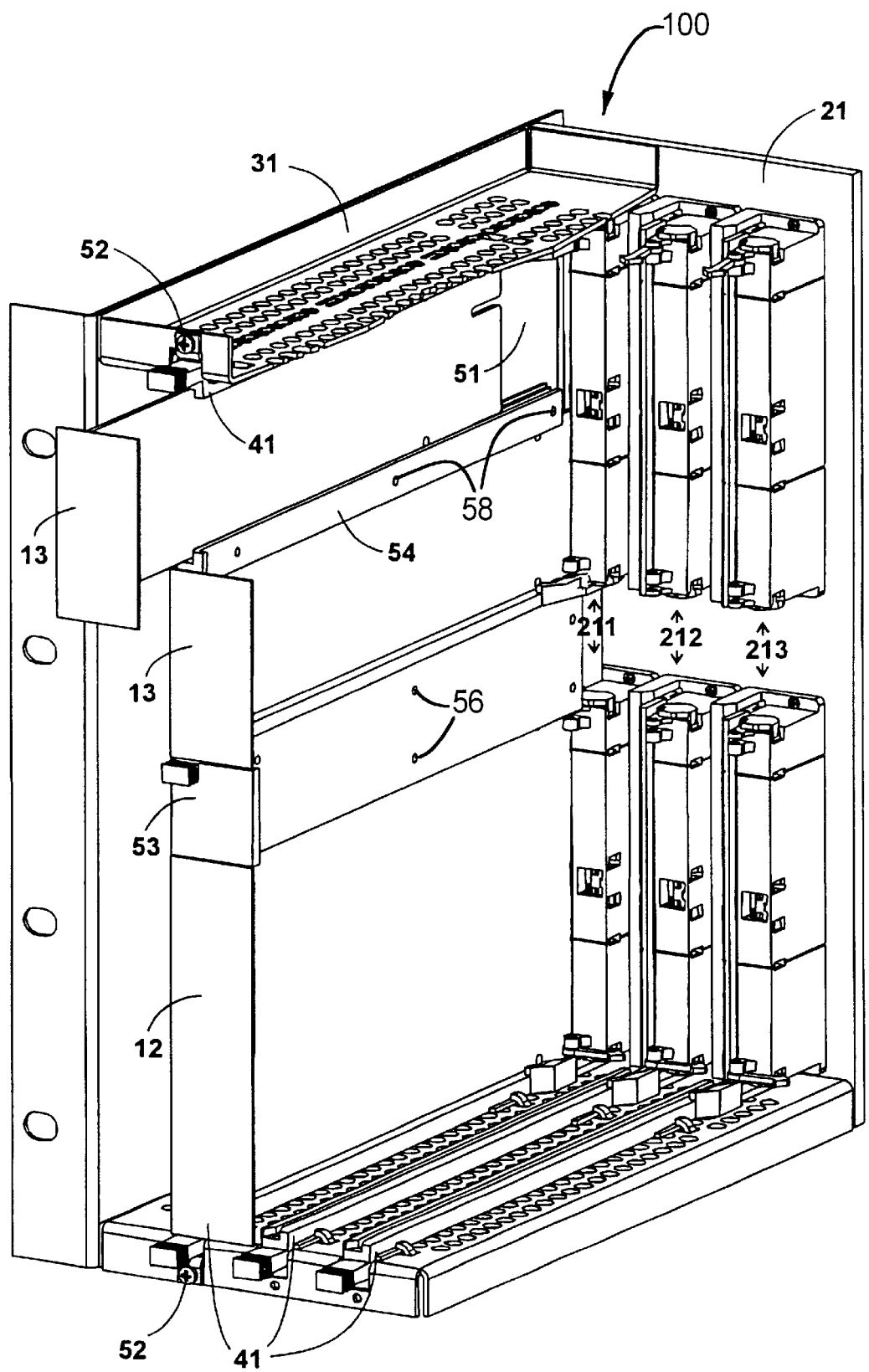
FIG. 5 is a perspective view of the system of FIG. 2, wherein a mid-sized and two smaller circuit boards arc being plugged into the chassis of the system.

Of the printed circuit boards to be connected, the printed circuit boards of the first type are referenced 11 in FIGS. 3, 12 in FIGS. 4 and 12 and 13 in FIG. 5. For the sake of simplicity, the printed circuit boards of the first type are referred to below as "first printed circuit boards" and printed circuit boards of the second type are referred to below as "second printed circuit board".

Figure 1:
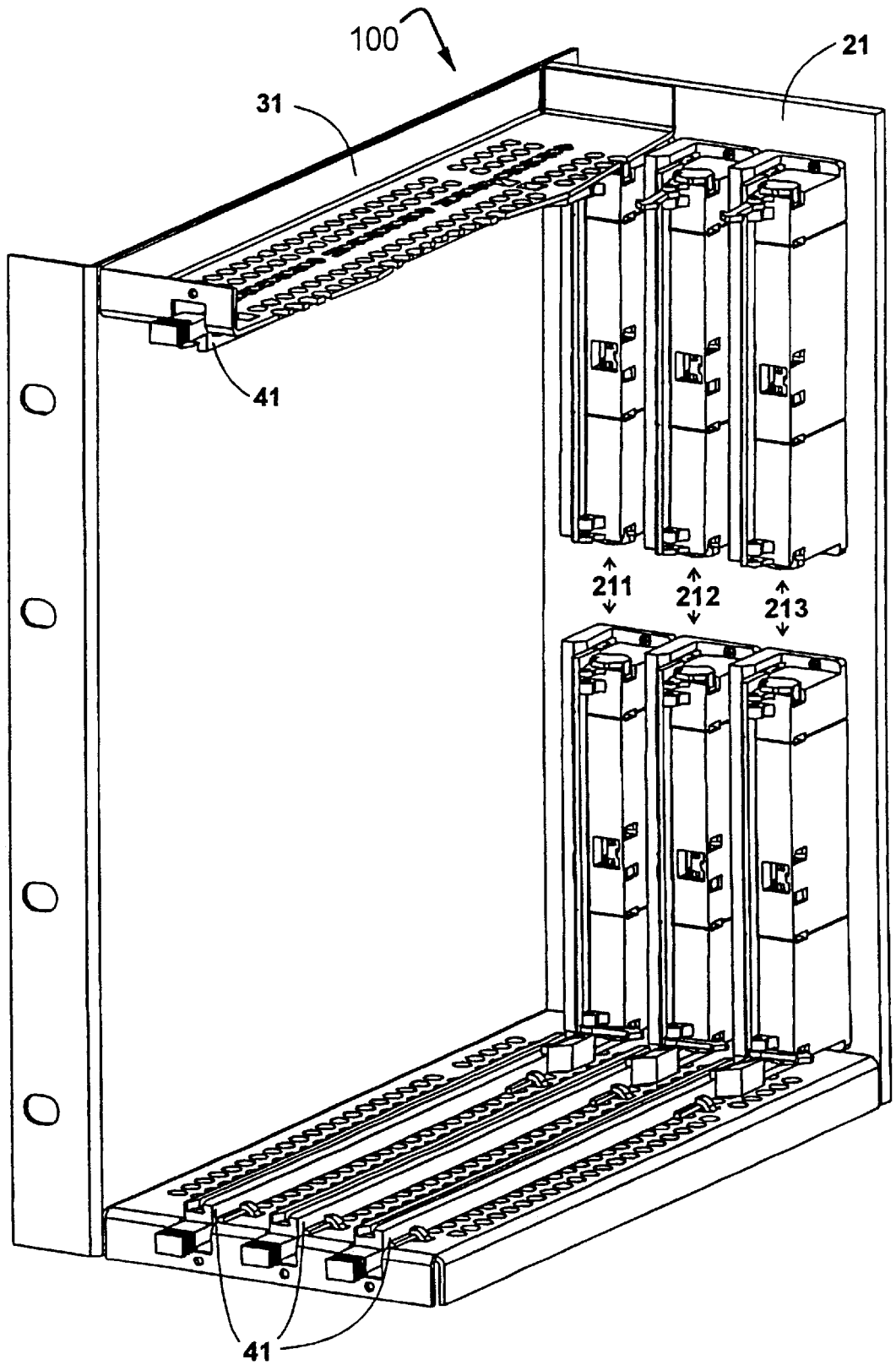
FIG. 1 is a perspective view of a system with a printed circuit board or chassis allowing a plugging in of printed circuit boards.
Figure 2:
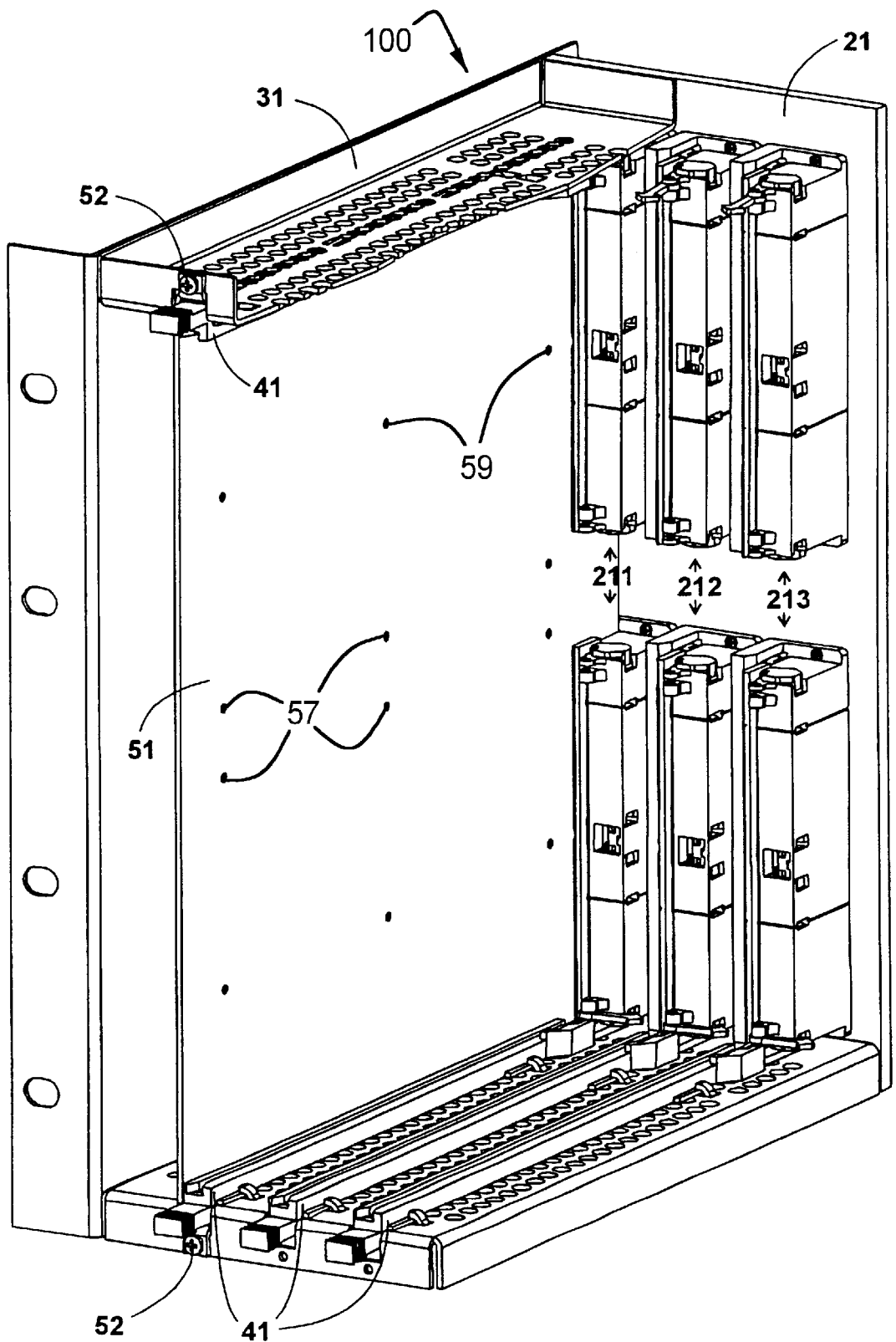
FIG. 2 is a perspective view of the system of FIG. 1 with a shielding plate introduced thereinto.

The system 100 is shown in FIG. 1 in a condition without the first printed circuit boards. In this illustrated condition, the system comprises a housing or frame 31, a second printed circuit board 21 and guide elements 41, which arc mounted on spaced apart frame members of the frame 31 for guiding the first printed circuit boards while they are being put in place on the second printed circuit board 21.

The surface of the second printed circuit board 21 is provided with printed circuit board connector pairs 211, 212 and 213, respectively composed of two printed circuit board connectors. As shall be explained in even greater detail later, one through four first printed circuit boards can be plugged into each of the printed circuit board connector pairs.

The above-mentioned guide elements 41 are provided above and below each and every printed circuit board connector pair. In the example being considered, the guide elements 41 are channel-like depressions or grooves proceeding in a longitudinal direction that extends perpendicular toward the plane of the second printed circuit board 21. A first printed circuit board can be guided to the printed circuit board connector pairs 211, 212 and 213 provided on the second printed circuit board 21 between the guide elements 41 lying above and below the respective printed circuit board connector pairs 211, 212 and 213 in the channel-like depressions thereof. The appertaining printed circuit board thereby proceeds into the allocated printed circuit board connector or connectors of the allocated printed circuit board connector pair.

In the intended condition with the first circuit board connected to the printed circuit board connector or to the connector pair on the second printed circuit board 21, for example at the latest after the printed circuit board has been brought into the connecting position, the first printed circuit board is firmly electrically and mechanically connected to the second printed circuit board 21. An additional fastening of the first printed circuit board to other system components is not required given the example being considered. Insofar as some other fastening is required or, for whatever reason, additionally provided, this preferably occurs so that it can be implemented given an operating system without disturbing and/or interrupting the operation of the system. This is possible, for example, when the fastening can be implemented or released proceeding from the side of the first printed circuit board facing away from the second printed circuit board 21.

Shielding plates 51 (FIG. 2) can be inserted next to or between the first printed circuit boards plugged into the second printed circuit board 21. Essentially, these shielding plates 51 are plate-like elements that serve the purpose of shielding the electromagnetic emission. They are inserted essentially parallel to the first printed circuit boards, next to or between these, and, at least in the example being considered, have their end facing away from the second printed circuit board fastened to the housing 31 by screws 52.

Inserted into the system in conformity with its intended use, the shielding plate 51 is electrically connected to ground. The connection of the shielding plate 51 to ground in the above-mentioned example occurs via the screwing thereof to the housing 31, which acts as a ground for the system.

It is possible to provide the shielding plate 51 between two lateral guide elements, like the first printed circuit boards. These guide elements could be guide elements specifically designed for guiding shielding plates 51 or the guide elements 41 for guiding the first printed circuit boards.

In the example being considered, the shielding plate 51 is not plugged into one of the printed circuit board connectors and also exhibits no other connection to the second printed circuit board. This is not required in the example being considered, since the connection of the shielding plate 51 to ground occurs, of course, via the screw connection to the housing 31. This, however, need not be so. The shielding plate 51 can also be plugged into a connector provided on the second printed circuit board 21 and be electrically connected to ground via this connection. The connector can thereby be a connector specifically provided for contacting the shielding plate 51 or one of the printed circuit board connector pairs 211–213. When the shielding plate is plugged into one of the printed circuit board connector pairs 211–213, care must be exercised to see that only the grounding contacts of the appertaining printed circuit board connector come into contact with the shielding plate 51. Otherwise, the shielding plate 51 could short-circuit the contact elements of the printed circuit board connector. Additionally or alternatively, the shielding plate 51 can also be grounded via potentially existing guide elements by which the shielding plate 51 is laterally guided. These guide elements can contain contact elements connected to terminals to ground that contact the shielding plate 51, which is composed of metal, in its properly mounted condition.

The guide elements 41 can be provided with contact elements for producing electrical connection to the article they are guiding. Thus, in addition to guiding the element, such as the first printed circuit board, the contact element can also make contact therewith. When the first printed circuit boards are at least partially contacted by the guide elements 41, the printed circuit board connectors provided on the second printed circuit board 21 can be made smaller or even omitted.

As already mentioned above, up to four printed circuit boards can be plugged into each printed circuit board connector pair in the examples which are considered.

The condition wherein only one first printed circuit board 11, namely a maximally large first printed circuit board 11, is plugged into the circuit board connector pair 211 is shown in FIG. 3. The shielding plate 51 is also situated at the left next to the first printed circuit board 11, which is the position also shown in FIG. 2. In the illustrated configuration, this serves only for the shielding of electromagnetic emission and, if this is not required, the shielding, plate can be omitted.

In the present instance, the shielding plate 51 is employed not only for shielding electromagnetic emission, but also is employed as a carrier or support element for additional printed circuit board guides, such as guide elements 53 and 54. When the shielding plate 51 is employed as a carrier of additional printed circuit board guides, such as additional guide elements 53 or 54, then one or more smaller printed circuit boards can also be plugged into the printed circuit board connector pairs. The guide elements 41 provided above and below the printed circuit board connector pairs 211–213 can only guide a large first printed circuit board of the type of the first printed circuit board 11 shown in FIG. 3.

The condition in which the additional guide element 53 is mounted on a shielding plate 51 by threaded fasteners 56 received in threaded bores (FIG. 2) is shown in FIG. 4. The additional guide element 53 in this example is located roughly in the middle between the guide elements 41 arranged above and below the printed circuit board connector pair 211. As a result of this additional guide element 53, two mid-sized first printed circuit boards 12 and 12' can be inserted into the printed circuit board connector pair 211, whereby the one of the first printed circuit boards 12' is guided between the guide element 41 provided above the printed circuit board connector pair 211 and the additional guide element 53 and is plugged into the upper printed circuit board connector 211a of the printed circuit board connector pair 211. The other of the first printed circuit boards 12 is guided between the guide element 41 provided below the printed circuit board connector pair 211 and the additional guide element 53 and is plugged into the lower printed circuit board connector 211b of the printed circuit board connector pair 211.

Even more additional guide elements can be provided on the shielding plate 51. In FIG. 5, the additional guide element 54 is located roughly between the guide element 53 and the upper guide element 41. The guide element 54 is attached by threaded fasteners 58, which are threaded into threaded bores 59 (FIG. 2) of the shielding plate 51. As a result of this further or additional guide element 54, a mid-sized first printed circuit board 12 and two small first printed circuit boards 13 can be inserted into the printed circuit board connector pair 211. The mid-sized first printed circuit board 12 is guided between the guide elements 41 and the lower side of the guide element 53 and is plugged into the lower printed circuit board connector 211b of the printed circuit board connector pair 211. One of the small first printed circuit boards 13 is guided between the additional guide element 53 and the second additional guide element 54 and is plugged into the lower half of the upper printed circuit board connector 211a of the printed circuit board connector pair 211. The other of the small first printed circuit boards 13 is guided between the additional guide element 54 and the guide element 41 which is provided above the printed circuit board connector pair 211 and is plugged into the upper half of the upper printed circuit board connector 211a of the printed circuit board connector pair 211.

If yet another additional guide element is provided on the shielding plate 51 between the guide element 41 provided under the printed circuit board connector pair 211 and the first additional guide element 53, then a total of four printed circuit boards can be plugged into the allocated printed circuit board connectors.

An arbitrary plurality of additional guide elements can be arranged on the shielding plate 51 and the additional guide elements can be arranged at arbitrary locations of the shielding plate independently of one another. How many additional guide elements are provided and where exactly these are arranged on the shielding plate is mainly dependent on the size of the first printed circuit boards to be connected. So that a plurality of first printed circuit boards can be plugged per printed circuit board connector or per a printed circuit board connector unit comprising a plurality of circuit board connectors, the printed circuit board connectors and the I/O system practically realized by these must be correspondingly configurable or usable.

The above-mentioned system is advantageous in two respects: first, because the printed circuit board connectors provided on the second printed circuit board 21 can be optimally used or, given lateral contacting of the first printed circuit board via the guide elements 41, can be made smaller or omitted, and second, because the attachment, moving and removal of additional guide elements. Thus, the mounting and unmounting of the first printed circuit boards can occur in an operating system without disturbing or interrupting the operation thereof. Both the first printed circuit boards as well as the shielding plates 51 carrying the additional guide elements, such as 53 and 54, can be locked, unlocked, removed and introduced proceeding from their end or side facing away from the second printed circuit board 21 and, as a result thereof, can be quickly and simply introduced and locked or, respectively, unlocked and removed at any time.

The elements that carry the additional guide elements need not necessarily be shielding plates. It can also be a matter of arbitrary other devices that can be arranged next to or between the first printed circuit boards in the same way or similar to the shielding plate and that are suitable for carrying additional guide elements.

Independent of the details of the practical realization, the disclosed system makes it possible for a maximum plurality of plugin cards to be accommodated in a minimal space, whereby the addition and removal of the plugin cards, even given a running system, can occur quickly, simply and without disturbing or interrupting the operation of the system.

Although various minor modifications may be suggested by those versed in the art, it should be understood that I wish to embody within the scope of the patent granted hereon all such modifications as reasonably and properly come within the scope of my contribution to the art.

I claim:

1. A system comprising at least one printed circuit board of a first type, a printed circuit board of a second type, a frame supporting the printed circuit board of the second type and having a pair of spaced apart frame members extending perpendicular from the printed circuit board of the second type, guide elements being disposed in pairs on said frame members for guiding a printed circuit board of a first type into a pluggable connection to the printed circuit board of the second type, a plate-like support element extending between the pair of frame members next to a pair of the guide elements, and at least one additional guide element being provided on the support element between the pair of guide elements to cooperate with at least one of the guide elements of the pair to enable a pluggable connection of a printed circuit board of the first type having a size less than the spacing between the frame members.

2. A system according to claim 1, wherein the support element is removably mounted on the pair of frame members so that it can be introduced and removed during operation of the system.

3. A system according to claim 2, wherein the plate-like support element is a shielding plate for providing shielding of electromagnetic emission.

4. A system according to claim 1, wherein the support element is a shielding plate for shielding the electromagnetic emission.

5. A system according to claim 1, wherein at least one of the guide elements of each pair is provided with contact elements for electrically contacting an article being guided therein.

6. A system according to claim 5, which includes guide elements for electrically contacting the support element being adjacent the pair of guide elements for the printed circuit boards of the first type.

* * * * *